United States Patent [19]  
Drage

[11] Patent Number: 4,697,089  
[45] Date of Patent: Sep. 29, 1987

[54] DUAL WAVELENGTH SENSOR WHICH EMPLOYS OBJECT AS PART OF A CORNER REFLECTOR

[75] Inventor: David J. Drage, Sebastopol, Calif.

[73] Assignee: Tegal Corporation, Novato, Calif.

[21] Appl. No.: 875,820

[22] Filed: Jun. 18, 1986

[51] Int. Cl.⁴ .................... G01N 21/86; G01V 9/04
[52] U.S. Cl. ............................ 250/561; 250/223 R
[58] Field of Search ............... 250/560, 561, 222.1, 250/223 R

[56] References Cited

U.S. PATENT DOCUMENTS 3,932,763  1/1976  Weinstein .................. 250/222.1
4,557,435 12/1985  Reishus ...................... 250/561
4,564,085  1/1986  Melocik et al. ............ 250/222.1

Primary Examiner—David C. Nelms
Assistant Examiner—Stephone B. Allen
Attorney, Agent, or Firm—Paul F. Wille

[57] ABSTRACT

Two emitters, producing light at different wavelengths, and a single receiver provide an optical sensor useful for detecting the presence or position of objects having surfaces which do not totally reflect incident light.

9 Claims, 3 Drawing Figures

DUAL WAVELENGTH SENSOR WHICH EMPLOYS OBJECT AS PART OF A CORNER REFLECTOR

BACKGROUND OF THE INVENTION

This invention relates to optical means for detecting the presence or position of an object and, in particular, to optical means for detecting the presence or position of a semiconductor wafer.

In the prior art, a variety of schemes have been proposed or even tried for determining the placement of an object, e.g. a semiconductor wafer. One such scheme is purely mechanical, i.e. the wafer is positioned by means which force the wafer to a certain location; for example, tines or a conical depression. Since such handling will likely result in the generation of small particles, more gentle handling and optical detection are usually used.

As used herein, unless otherwise indicated, "light" refers to that part of the electromagnetic spectrum to which semiconductive material is or can be made photosensitive. As such, it includes at least the visible and infra-red portions of the spectrum.

One problem with optical detectors is that the wafer, e.g. silicon, is transparent at infra-red wavelengths commonly used for emitters. Another problem is that scattering of the light by the surface of the wafer causes erroneous readings in the detector circuitry. Similarly, destructive interference of the light by various layers on the wafer can cause erroneous readings. Further, the alignment of the emitter and detector is often a problem due to vibration or use of the equipment incorporating the detector.

In view of the foregoing, it is therefore an object of the present invention to provide an improved optical presence or position detector.

Another object of the present invention is to provide an improved optical detector for use with semiconductor wafers.

A further object of the present invention is to provide an improved optical detector for use with surfaces having one or more layers thereon which can cause destructive interference.

Another object of the present invention is to provide an improved optical detector having better alignment control.

SUMMARY OF THE INVENTION

The foregoing objects are achieved in the present invention wherein two light sources and a single receiver are combined with a corner reflector, of which the wafer is a part, to provide accurate placement or position information. The light sources emit light at different wavelengths. The detector is sensitive to light at both wavelengths. By using this combination, alignment is more accurate and spurious readings are reduced.

A more complete understanding of the present invention can be obtained by considering the following detailed description in conjunction with the accompanying drawings, in which:

DETAILED DESCRIPTION OF THE DRAWINGS

Figure 1:
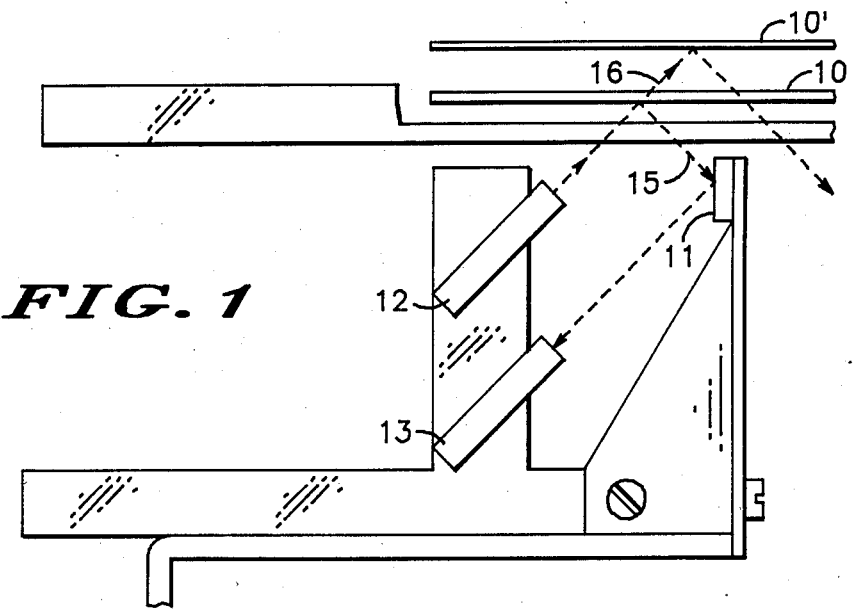
FIG. 1 illustrates a side view of a preferred embodiment of the present invention.

FIG. 1 illustrates a preferred embodiment of the present invention wherein emitter 12 and receiver 13 are positioned relative to wafer 10 and reflector 11 such that a beam of light from emitter 12 is reflected by wafer 10 and mirror 11 back to detector 13. Thus, when wafer 10 is properly positioned, wafer 10 and reflector 11 form a corner reflector which redirects the beam along path 15 to detector 13.

Emitter 12 and detector 13 are physically small devices and can conveniently be positioned anywhere relative to wafer 10, preferably near an edge thereof. Emitter 12 and detector 13 may comprise any suitable device but preferably comprise infra-red emitters such as are available from Texas Instruments Incorporated, Models TIL 906 and TIL 39. Detector 13 preferably comprises an infra-red detector such as Model TIL 414. Mirror 11 can comprise any suitable reflecting surface and preferably comprises a polished surface on an aluminum member fastened within a wafer transport (not shown). Emitter 12 and detector 13 can be suitably mounted in the wall portion of the wafer transport. As thus constructed, there are no alignment problems as occur with other position detectors.

If a wafer, such as wafer 10', comes to rest at a position other than the desired position, the beam from emitter 12 follows path 16 and strikes wafer 10' and is reflected therefrom along a path such as path 17, which does not intercept mirror 11. Thus, no light is detected by detector 13 and the misadjustment of wafer 10' is readily sensed. While wafer 10' is illustrated as parallel to the desired position of wafer 10, the apparatus of the present invention works equally well with wafers which are not parallel to the desired position. The effect of an improperly positioned wafer is to destroy the corner reflector utilizing the wafer as one portion thereof, i.e. the misadjustment causes virtually no light to be incident upon detector 13 from emitter 12.

Figure 2:
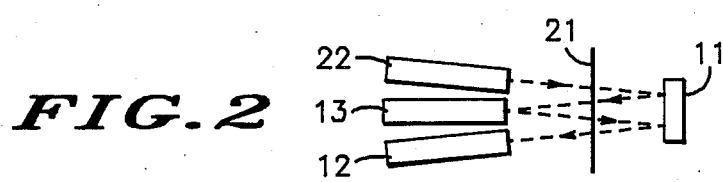
FIG. 2 illustrates a top view of a preferred embodiment of the present invention.

FIG. 2 illustrates a further feature of the present invention where two emitters are utilized, each emitter operating at a different wavelength. As illustrated in FIG. 2 a second emitter 22 is positioned relative to detector 13 so that light emitted thereby is reflected from wafer 10 to reflector 11 and then to detector 13. When properly positioned the light incident upon wafer 10 falls somewhere along line 21 as illustrated in FIG. 2.

The use of a dual wavelength detector enables one to avoid problems of detection due to destructive interference of the light from the wafer. Typically the silicon wafer comprises one or more layers on one surface thereof. In the same manner as occurs in the common experience of seeing a rainbow in a film of oil on the surface of water, destructive interference can take place such that light will not be detected by detector 13 even though wafer 10 is properly positioned. This destructive interference depends upon the index of refraction of the layer on the wafer as well as the wavelength of the incident light. That is, the film thickness (d) for destructive interference is given by $$d = \frac{(m + \frac{1}{2})\lambda}{\cos \theta_2 \, 2n}$$

where
- M = maxima — 0, 1, 2, 3, ...
- λ = wavelength
- $\theta_2$ = refracted angle
- sin $\theta_2$ =
- $\theta_1$ = incident angle
- n = index refraction The following table lists some film thicknesses at which destructive interference occurs for light having a wavelength of 880 nm. or 940 nm. and an angle of incidence of 75 degrees.

|  | 880 nm. | 940 nm. |
|---|---|---|
| for thermal oxide (n = 1.45) | | |
| m = 0 | 203 nm. | 217 nm. |
| m = 1 | 610 | 652 |
| m = 2 | 1017 | 1086 |
| for silicon nitride (n = 2.00) | | |
| m = 0 | 126 nm. | 134 nm. |
| m = 1 | 377 | 403 |
| m = 2 | 628 | 671 |
| for polysilicon | | |
| m = 0 | 77 nm. | 83 nm. |
| m = 1 | 232 | 248 |
| m = 2 | 387 | 414 |

As readily seen from the foregoing, destructive interference is extremely difficult, if not impossible, to produce for both wavelengths, such as 880 nm. and 940 nm. One thus obtains a position detector which is mechanically simple to manufacture and use and yet is reliable in a variety of circumstances. Further, unlike capacitive or single wavelength detectors, a detector in accordance with the present invention provides reliable detection of substrates made from silicon, aluminum, sapphire, glass/quartz, and gallium arsenide.

The emitted light can be continuous or pulsed. If the latter, one obtains an additional advantage of further improving the reliability of the detection by providing a particular signal which must be detected. That is, stray light is much less likely to cause errors. In addition, one obtains the ability to check the operation of the system rather simply. For example, when the emitters are alternately pulsed so that the pulses do not overlap, one obtains a detected signal at a given frequency. In the event one of the emitters fails, the frequency is halved. This is easily detected.

Figure 3:
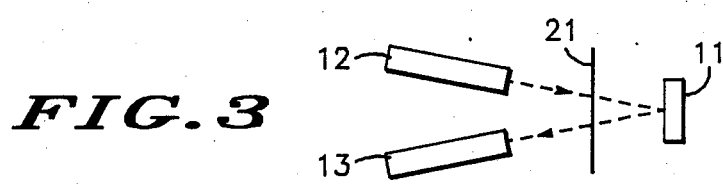
FIG. 3 illustrates an alternative embodiment of the present invention.

FIG. 3 illustrates an alternative embodiment of the present invention wherein separate detectors are used for each emitter. Thus, the top view of the present invention comprises simply emitter 12 and detector 13. One simply duplicates the emitter and detector for an additional wavelength. Preferably the emitters cause light to be incident upon wafer over a relatively large area, in terms of surface features, and over a common area. For example, if the wafer comprises line widths of two microns, it is desirable to have the incident beam cover a diameter of several microns.

Having thus described the invention it will be apparent to those of skill in the art that various modifications can be made within the spirit and scope of the present invention. For example, the particular wavelengths chosen are determined in part by the use of readily available emitters and detectors. Any two wavelengths can be used, provided one is not a multiple or factor of the other. Further, while described in terms of a silicon wafer, it is understood by those of skill in the art that the present invention is suitable for detecting the presence of any medium not totally reflective of incidence light. In addition, the angle of incidence of the beam on the wafer is a matter of choice depending upon the material used in the layer on the wafer. For example, the amount of light reflected by a glass ($SiO_2$) layer approximately doubles if the angle of incidence is changed from 45 to 75 degrees. In accordance with the present invention it is preferred that the angle of incidence be greater than about 60 degrees.

I claim:

1. Optical detecting means comprising:
    a first means for emitting light at a first wavelength;
    a second means for emitting light at a second wavelength;
    detector means; and
    corner reflector means, including an article to be sensed, for re-directing light from said first and second emitters to said detector means.

2. The apparatus as set forth in claim 1 wherein said detector means comprises:
    a single photosensitive device responsive to both said first and said second wavelength.

3. The apparatus as set forth in claim 1 wherein said detector means comprises:
    first and second photosensitive devices responsive to said first and second wavelengths, respectively.

4. The apparatus as set forth in claim 1 wherein said first and second emitting means are positioned adjacent to said detector means.

5. The apparatus as set forth in claim 4 wherein said corner reflector comprises:
    an article whose presence is being detected; and
    mirror means for re-directing a beam of light back along a path approximately parallel to a beam incident upon said corner reflector.

6. The apparatus as set forth in claim 5 wherein said mirror means comprises a member having a portion of the surface thereof smoothly polished.

7. The apparatus as set forth in claim 1 wherein said first and second emitter means are positioned so that light emitted therefrom is incident upon said article at an angle greater than about sixty degrees.

8. The apparatus as set forth in claim 1 wherein said first and second means for emitting light produce pulsed light for detecting said article.

9. The apparatus as set forth in claim 1 wherein said first and second means for emitting light produce continuous light for detecting said article.

* * * * *